United States Patent [19]
Reedy et al.

[11] Patent Number: 5,066,613
[45] Date of Patent: Nov. 19, 1991

[54] PROCESS FOR MAKING SEMICONDUCTOR-ON-INSULATOR DEVICE INTERCONNECTS

[75] Inventors: Ronald E. Reedy; Graham A. Garcia; Isaac Lagnado, all of San Diego, Calif.

[73] Assignee: The United States of America as represented by the Secretary of the Navy, Washington, D.C.

[21] Appl. No.: 380,175

[22] Filed: Jul. 13, 1989

[51] Int. Cl.$^5$ .......................................... H01L 21/283
[52] U.S. Cl. ...................... 437/200; 437/43; 437/51; 437/913; 148/DIG. 147; 148/DIG. 19
[58] Field of Search ............... 437/84, 200, 51, 43, 437/913; 148/DIG. 150, DIG. 82, DIG. 147, DIG. 19; 357/23.7

[56] References Cited

U.S. PATENT DOCUMENTS

| | | | |
|---|---|---|---|
| 4,276,688 | 7/1981 | Hsu | 437/84 |
| 4,336,550 | 6/1982 | Medwin | 148/DIG. 147 |
| 4,425,700 | 1/1984 | Sasaki et al. | 437/84 |
| 4,546,376 | 10/1985 | Nakata et al. | 357/23.7 |
| 4,554,572 | 11/1985 | Chatterjee | 357/23.7 |
| 4,643,777 | 2/1987 | Maeda | 148/DIG. 147 |
| 4,649,626 | 3/1987 | Leong | 29/571 |
| 4,656,731 | 4/1987 | Lam | 29/576 |
| 4,698,659 | 10/1987 | Mizutani | 357/42 |
| 4,724,530 | 2/1988 | Dingwall | 365/156 |
| 4,954,855 | 9/1990 | Mimura et al. | 357/23.7 |
| 4,965,213 | 10/1990 | Blake | 357/23.7 |
| 4,974,041 | 11/1990 | Grinberg | 357/23.7 |

FOREIGN PATENT DOCUMENTS 0226957 10/1986 Japan .

OTHER PUBLICATIONS

Reedy et al., "Thin (100 nm) SOS for Application to Beyond VLSI Microelectronics", Mat. Res. Soc. Symp. Proc., vol. 107, 1988.

*Primary Examiner*—Brian E. Hearn
*Assistant Examiner*—Tuan Nguyen
*Attorney, Agent, or Firm*—Harvey Fendelman; Thomas Glenn Keough

[57] ABSTRACT

A process for developing conductive interconnect regions between integrated circuit semiconductor devices formed on an insulating substrate utilizes the semiconductor material itself for formation of device interconnect regions.

A patterned layer of semiconductor material is formed directly on the surface of an insulating substrate. The patterned layer includes regions where semiconductor devices are to be formed and regions which are to be used to interconnect terminals of predetermined ones of the semiconductor devices. After forming the semiconductor devices in selected regions of the semiconductor material, the regions of the semiconductor material patterned for becoming interconnects are converted to a metallic compound of the semiconductor material.

12 Claims, 3 Drawing Sheets

PROCESS FOR MAKING SEMICONDUCTOR-ON-INSULATOR DEVICE INTERCONNECTS

BACKGROUND OF THE INVENTION

The present invention relates generally to the fields of semiconductors and integrated circuits and, more particularly, to structures, techniques, and processes for providing interconnects and for interconnecting devices in integrated circuits.

Of the numerous requirements for advanced very large scale integrated (VLSI) silicon microelectronics, power dissipation per unit area, speed, packing density and radiation hardness are especially important. Power dissipation and speed have forced an evolutionary path from PMOS to NMOS to NMOS E/D and to the currently used CMOS. As evidenced by the large number of publications, CMOS on insulating substrates is receiving increased attention due to its potential as the next generation in MOS evolution.

Silicon on insulators (SOI) is a technology which is receiving increasing attention for next generation integrated circuits requiring significantly reduced power dissipation and gate delay along with increased packing density and isolation. Furthermore, as lateral scaling continues, vertical dimensions of integrated circuits must be reduced: n+ and p+ source and drain regions 100 nanometers (nm) deep or less will facilitate the design and fabrication of sub-500 nm gate length MOSFETs with long channel behavior.

Silicon on sapphire (SOS) is the most mature SOI candidate with the following advantageous characteristics: large area single crystal film, full dielectric isolation with virtually zero substrate capacitance, a track record for application to VLSI and commercial availability of well characterized material (up to 5 inch wafers).

Lau, et al (S. Lau, S. Matteson, J. Mayer, P. Revesz, J. Gyulai, J. Roth, T. Sigmon and T. Cass, Applied Physics Letters, 34, 76 (1979)) originally demonstrated that the crystalline quality of SOS films could be improved by utilizing a silicon implant to create a buried amorphous layer followed by a thermal anneal which causes regrowth of an improved film from the surface downward, a process known as Solid Phase Epitaxy (SPE). Inoue and Yoshii applied the SPE technique to thin (185 nm) films (T. Inoue, T. Yoshii, Applied Physics Letters 36 (1), 64 (1980)) and reported significantly improved device performance in a double SPE (DSPE) process (T. Yoshii, S. Taguchi, T. Inoue and H. Tango, Japan Journal of Applied Physics, 21 (supl. 21-1), 175 (1982)).

Another DSPE process is described by R. Reedy, T. Sigmon and L. Christel in Applied Physics Letters, 42, 707 (1983) hereby incorporated by reference in its entirety. That described DSPE process uses a first $1 \times 10^{15}$ cm$^{-2}$ $^{28}$Si implant at 170 keD, followed by a double anneal: 550° C./2 hours 1050° C./1 hour in nitrogen. The sequence is then repeated but with a 100 keV, $2 \times 10^{15}$ cm$^{-2}$ implant. Adequate thermal contact must be provided during implant to prevent self annealing. Further details of this DSPE process are also described in "THIN (100 nm) SOS FOR APPLICATION TO BEYOND VLSI MICROELECTRONICS", Ronald E. Reedy and Graham A. Garcia, Materials Research Society Symposium Proceedings, volume 107, p. 365-376, hereby incorporated by reference in its entirety.

Conventional CMOS devices are fabricated by defining the gate (G), source (S), and drain (D) regions in either bulk silicon or 500 nm thick SOS. For conventional SOS, 500 nm thickness is required to insure high device performance. Generally, the entire structure is then coated with an insulating layer and contact holes are opened to interconnect devices in the integrated circuit via a metallization layer which is applied over the insulating layer and into the contact holes to contact the devices. The area requirement of the contact window is up to 50% of the transistor area. For short (sub-micron) gate lengths the S and D junctions must be 150 nm deep or less. Utilizing current techniques, considerable difficulty is encountered in forming these junctions and greater difficulty is encountered in making contact to them. As device dimensions approach 150 nm, it is envisioned that junction depths of 50 nm or less will be required. It is expected that forming and contacting such junctions by conventional, known techniques will be an extremely low yield process. Further, the step height for contact formation is determined by the oxide thickness necessary to ensure isolation as well as to reduce metal to substrate capacitance. The metallization layer must be thick enough to cover this step height. Etching thick metal lines is difficult especially where the metal becomes thinner at steps, leading to electromigration failure.

SUMMARY AND OBJECTS OF THE INVENTION

To overcome the shortcomings of the previously described integrated circuit technology, the present invention comprises a process, technique and associated integrated circuit structure created thereby in which conductive interconnects between integrated circuit semiconductor devices that are formed on an insulating substrate are formed in the semiconductor material itself on the surface of the insulating substrate by converting selected regions of the semiconductor material to a metallic compound of the semiconductor material. Further, in accordance with the present invention, a portion of selected terminals of the devices formed in the semiconductor material is also converted to the metallic compound of the semiconductor material substantially simultaneously with the conversion of the semiconductor material regions to interconnect regions.

In accordance with the present invention a patterned layer of semiconductor material is formed on an insulating substrate. Preferably, the semiconductor material is extremely high quality material such as may be formed by DSPE improved SOS. Then, by well known techniques, semiconductor devices are formed in selected regions of the semiconductor material. Next, portions of the terminals of the semiconductor devices to be interconnected and regions of the semiconductor to be converted to interconnect regions are converted to a metallic compound of the semiconductor material to thereby form improved conductivity device terminals as well as the aforesaid interconnect regions.

Thus, within the scope of the present invention, integrated circuits may be manufactured wherein any one or more of the terminals of any number of semiconductor devices may be interconnected within the integrated circuit or may be provided with interconnects to other integrated circuits or electrical devices by creating a metallization region or regions in the semiconductor material that is formed on top of an insulating substrate. The semiconductor material itself is thus used as the medium for the formation of the interconnect(s). The interconnect scheme of the present invention may be used by itself or with additional, upper level metallization layers.

The process and devices created by the process of the present invention thus results in integrated circuit semiconductor devices interconnected by regions in the semiconductor material itself thereby resulting in reduction of device, design and processing complexity of integrated circuits with concomitant improvement in speed, power and packing density. The process and design of the present invention eliminates the need for a contact mask by providing a self aligned, planar first level metallization while simultaneously providing dielectrically isolated circuitry particularly suitable for CMOS structures.

In accordance with the present invention, because the semiconductor film utilized is on the order of 100 nm thick, the thin junction requirements of conventional processing are eliminated. No special steps such as preamorphization, low energy non-channeling implants or non-defusing anneals are necessary. Furthermore, metal spiking through the junctions is eliminated by the insulating substrate. Also, from one to three mask levels are eliminated by the present invention as compared to bulk Si CMOS structures.

Further, because some of the contact windows necessary to be formed in upper level metallization layers in prior art structures is eliminated by the present invention, the packing density of active devices is increased dramatically by the present invention.

In accordance with the present invention, the normally required 5:1 ratio minimum of gate length to junction depth can be achieved at gate lengths down to 100 nm. This can be achieved in accordance with the present invention by thinning the silicon film used to 20 nm, thereby defining the junction depth. Doing so can lead to a manufacturable CMOS process with gate dimensions down to 0.1 micron.

The present invention also achieves large parasitic capacitance reduction thereby increasing device speed and reducing power dissipation. Reduced silicon volume also increases hardness to some radiation events. Reduced area requirements in accordance with the present invention permits significantly higher gate counts on a chip, thereby increasing computational throughput. Due to the high thermal conductivity of sapphire at cryogenic temperatures, even higher performance can be expected at low (77K) temperatures.

An additional advantage of the present invention is the reliability of devices created by it due to reduced device size, planarization of first level metal, reduced number of mask levels and ease of shallow junction formation.

Reduction in mask level count and self alignment of contacts associated with the present invention reduces design complexity and eases error checking requirements. Further, elimination or reduction of parasitic variables such as contact resistance eases circuit simulation requirements.

Due to the ultra thin semiconductor film thickness and the high temperature capabilities of the metallic compound of the semiconductor material used in this present invention, CMOS circuitry fabricated in accordance with the present invention will be capable of very high temperature (up to 300° C.) operation and thus serves as an additional advantage and object of the present invention. The thin, lightly doped semiconductor material used in accordance with the present invention will avoid temperature dependence of threshold voltage which limits conventional CMOS and the silicide as metallization will avoid metal spiking and migration found in normal metallization schemes at high temperatures.

These and other objects and other attendant advantages of this invention will be readily appreciated as the same becomes better understood by reference to the following detailed description when considered in connection with the accompanied drawings.

BRIEF DESCRIPTION OF THE DRAWINGS

Specifically, FIG. 1A shows the process step of delineating n-channel and p-channel regions in an SOS structure in the formation of a CMOS transistor pair.

FIG. 1B shows the process step of defining and etching polysilicon gates in the formation of said CMOS pair.

FIG. 1C illustrates the formation of source and drain regions and formation of side wall spacers.

FIG. 1D illustrates the step of titanium deposition and selective etching to define the interconnect regions in accordance with the present invention and is a cross section taken along lines 1D—1D of FIG. 2.

FIG. 1E shows, by way of example, a further process step that may be utilized in accordance with the present invention to form a conventional metallization interconnect layer following formation of the interconnect layer in accordance with the present invention.

DESCRIPTION OF THE PREFERRED EMBODIMENT

Figure 1A:
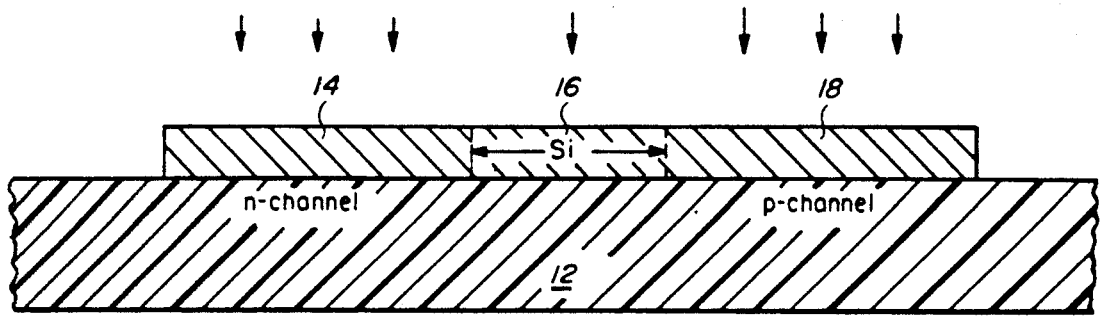
FIGS. 1A, 1B, 1C, 1D, and 1E are sequential processing steps showing, by way of example, in cross-sectional side views of portions of an integrated circuit, the process of the present invention of selectively metallizing regions of semiconductor material to form interconnect regions.

The present invention will now be described with reference to the various drawing FIGURES included in this disclosure and wherein like reference numerals designate like or similar parts throughout the several views of this disclosure. It is to be understood that the several views contained in this disclosure and the descriptions accompanying such views and illustrations are given by way of example only and that the scope of the present invention is not limited by such descriptions or the attendant illustrations contained herein.

Referring to FIG. 1A there is illustrated an insulating substrate 12. This insulating substrate 12 preferably is comprised of sapphire although, within the scope of the present invention, any other insulating substrate upon which suitable, high quality semiconductor material, preferably silicon, may be formed. In the preferred embodiment of the present invention SOS structure is utilized. Accordingly, and by way of example, a single crystal silicon mesa comprised of regions 14, 16 and 18 is formed by well known techniques on the sapphire substrate 12. Single crystal silicon region 14, in the present example, is to be formed into an n-channel region and single crystal silicon region 18 is to be formed into a p-channel region as is well known. Single crystal silicon region 16, in the present example, is to be converted to a metallic compound of the silicon semiconductor material to thereby ultimately form an interconnect between the n-channel field effect transistor and the p-channel field effect transistor to be formed in regions 14 and 18, respectively. In accordance with the present invention, the entire silicon region 14, 16 and 18 is improved using DSPE processing as described above and is well-known. The silicon semiconductor film further is thinned as by oxidation as is also well known to result in a final silicon semiconductor film thickness on the order of 50-100 nm. Well known etching/patterning techniques are used to result in the silicon regions 14 and 18 and also, by patterning techniques, to etch away any of the semiconductor material not intended for use as interconnect regions such as region 16 in the present example. Although regions for fabrication of only two devices are illustrated in the present example, it is to be understood that such example is for purposes of simplicity of illustration and explanation only and that any numbers of devices and corresponding interconnects may be made within the scope of the present invention.

Thus, by etching, a first set of regions is created where the semiconductor devices on the substrate 12 are to be formed. The semiconductor devices may comprise diodes, transistors, resistors and/or capacitors or any other two-terminal or three-terminal semiconductor devices or any combination thereof depending upon the specific design and requirements of the integrated circuit(s) or wafer(s) being manufactured. Further, the etching process is simultaneously utilized to pattern a second set of regions in the silicon semiconductor film to be utilized as interconnect regions. In accordance with the present invention, therefore, those regions of the semiconductor film that will not be utilized as interconnect and that will not be utilized for semiconductor device fabrication are etched away.

Next, continuing the present example, ion implantation is utilized to develop the p-channel thresholds and, subsequently, as is well known, ion implantation is utilized to develop the n-channel thresholds to thereby define both the n-channel and p-channel regions in semiconductor regions 14 and 18, respectively. As is well known, the threshold voltages for the n-channel and p-channel regions 14 and 18, respectively will be determined by the specific design requirements of the devices being formed. It is to be understood that the n-channel and p-channel implantation processing steps described above are specific to the formation of field effect transistors and that such steps are stated by way of example only. It is to be further understood that other well known processing steps may be utilized within the scope of the present invention to form other types of semiconductor devices such as those delineated above and that the subsequent processing steps described with reference to FIGS. 1A, 1B, 1C, 1D and 1E are specific to the formation of a CMOS pair. Notwithstanding the description and illustration of this specific example within the scope of the present invention, it is to be understood and appreciated that it is within the scope of the present invention that other device processing steps could also be used subsequently, prior to and/or in addition to those described to form the same and/or other types of semiconductor devices.

Figure 1B:
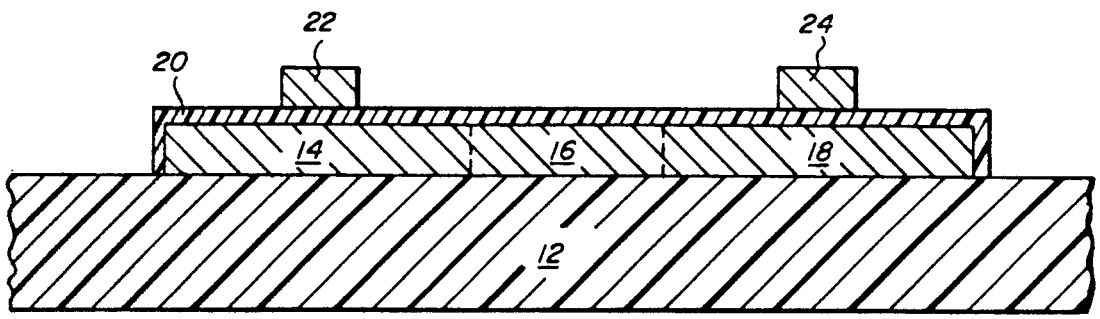
Figure 1C:
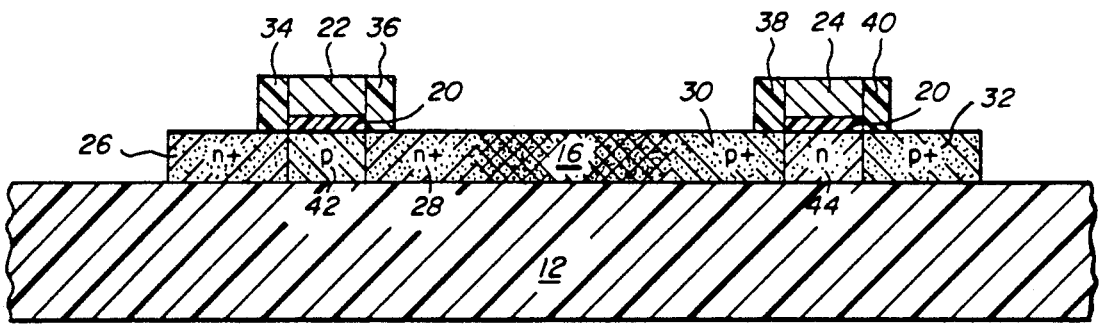

Referring to FIG. 1B, by well known techniques gate oxide layer 20 which may, for example, comprise silicon dioxide ($SiO_2$) is grown. On top of gate oxide layer 20, polysilicon material is deposited, doped, defined and etched to create polysilicon gate regions 22 and 24 as will be readily appreciated by those of ordinary skill in this art.

Integrated circuit/wafer processing continues in accordance with the present invention in accordance with well known techniques. Particularly, source/drain regions are defined and implanted. Specifically, silicon dioxide layer 20 is removed from the surfaces of regions 14, 16 and 18 except for those portions directly beneath polysilicon gate regions 22 and 24. Also, the source/drain n+ regions 26 and 28 and the source/drain p+ regions 30 and 32 are defined and implanted. Another silicon dioxide layer is then deposited and etched anisotropically to form the sidewall spacers 34, 36, 38 and 40 as is well known. The structure resulting from the sequence of process steps illustrated schematically in FIG. 1C thus includes source/drain terminals 26 and 28 adjacent p-type region 42 over which lies polysilicon gate 22 and insulated therefrom by silicon dioxide insulating layer 20 to thereby comprise an n-channel transistor structure. Likewise, source/drain terminals 30 and 32 are adjacent n-type region 44 over which lies polysilicon gate region 24 and insulated therefrom by silicon dioxide insulator material 20 to thereby comprise a p-channel transistor structure. It is noted that, at this point, the source/drain terminal 28 is interconnected to the source/drain terminal 30 by semiconductor region 16.

It may also be readily understood that polysilicon regions 22 and 24 have been used as masks or shields to thereby define the n+ regions 26 and 28 and, likewise, to define the p+ regions 30 and 32, thus constituting well known self-aligned gate processing techniques. It should also be readily understood that the interconnect region 16 may, without deleterious effect, be implanted during the creation of these source/drain regions and that no additional masking of the region 16 during the formation of the source/drain regions is necessary or required within the scope of the present invention.

Figure 1D:
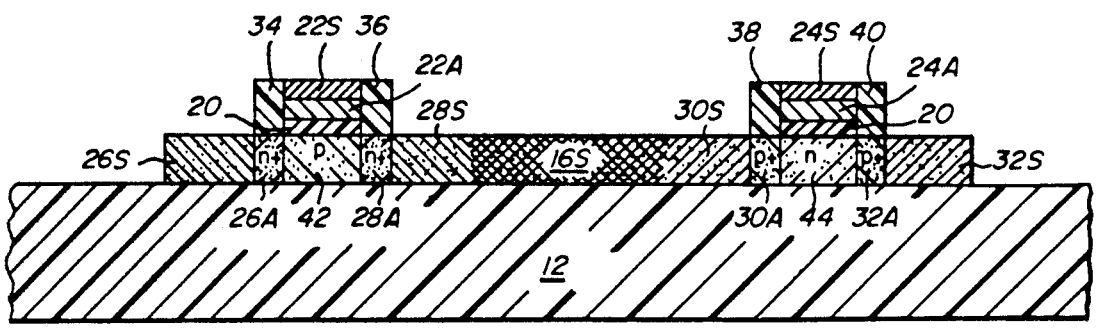

Referring to FIG. 1D there is illustrated the next sequence of process steps utilized to form the interconnect regions in accordance with the present invention. Specifically, to result in the structure illustrated in FIG. 1D, a titanium layer has been deposited over the structure illustrated in FIG. 1C. The titanium layer is deposited approximately to the same thickness as that of the original silicon semiconductor film. While utilization of titanium is specifically described in the present embodiment of this invention, it is to be understood that any other material or materials could be used so long as they convert the exposed semiconductor material to a metallic compound of that semiconductor material. In the instant example where titanium is utilized, followed by rapid thermal annealing in a nitrogen ambient, regions 26S, 28S, 30S and 32S of source/drain regions 26, 28, 30 and 32, respectively, have been converted to form titanium di-silicide ($TiSi_2$). The source/drain region formerly referred to as region 26 now comprises two regions, region 26S that has been converted to a titanium di-silicide region and the remaining unconverted n+ region 26A. Similarly, the source/drain region previously referred to as region 28 now comprises two regions, region 28S that has been converted to titanium di-silicide region and the remaining unconverted n+ region 28A. Concomitantly, the source/drain regions previously referred to as regions 30 and 32 now comprise titanium disilicide regions 30S and 32S, respectively, and p+ regions 30A and 32A, respectively. Substantially simultaneously with the conversion of these source/drain regions to a metallic compound of the silicon semiconductor, the interconnect region previously referred to as region 16 has also been converted to titanium di-silicide region 16S as is illustrated in FIG. 1D.

It can now be readily appreciated that the source/drain regions 28 and 30 have been interconnected through interconnect region 16S formed in the semiconductor material itself directly on the insulating substrate 12.

Following rapid annealing of the deposited titanium layer the polysilicon gate regions previously referred to as regions 22 and 24 also are partially converted to a metallic compound referred to herein as "polycide" to indicate that the polysilicon gate material has been converted to the metallic compound created via reaction of polysilicon with titanium. The converted regions are referred to in FIG. 1D as regions 22S and 24S, respectively and the regions remaining in polysilicon form are referred to in FIG. 1D as regions 22A and 24A, respectively.

Since titanium may have the effect of forming titanium nitride on any oxides exposed in the structure, e.g. the silicon dioxide sidewall spacers 34, 36, 38 and 40, in accordance with the present invention, the structure thus far fabricated is selectively etched to remove such titanium nitride as well as any titanium that has not reacted with the semiconductor to form the metallic compound of the semiconductor, e.g. silicide in the present example.

Figure 1E:
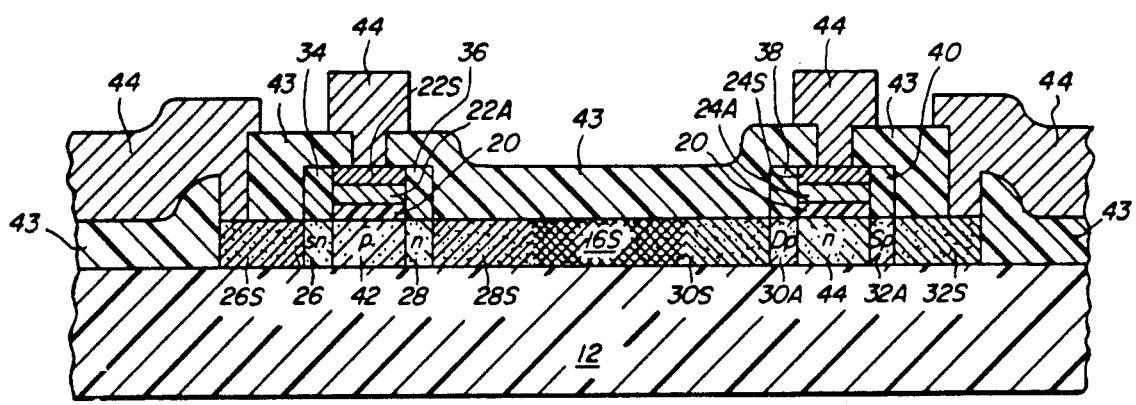

FIG. 1E illustrates how the structure as illustrated in FIG. 1D can be further processed to form a metallization layer to be used as a second level interconnect layer in accordance with the present invention. As would be readily understood, the structure thus far developed can further be processed so as to form a silicon dioxide layer 43 overlying the structure and devices created by the processing illustrated by FIG. 1D and, by well known techniques by opening contact windows within said insulating silicon dioxide layer and thereafter applying through conventional metallization techniques a metal layer 44. Thus, as can be readily appreciated, the present invention can be utilized not only in and of itself but in conjunction with and in addition to conventional metallization interconnect processes.

Figure 2:
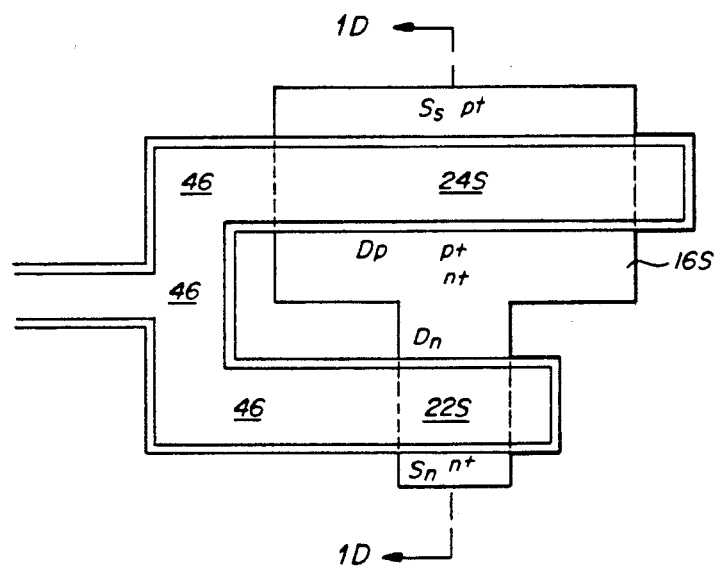
FIG. 2 is a top view of the structure illustrated in FIG. 1D.

Referring to FIG. 2 there is illustrated a top view of the structure illustrated in FIG. 1D. As can be seen in FIG. 2 the p-channel device on the top is interconnected to the n-channel device on the bottom via interconnect region 16S. Also illustrated in FIG. 2 and in accordance with the present invention, the gates 22 and 24 of the corresponding transistors are shown to be interconnected via polycided regions 46 which had been formed by suitable patterning of the polysilicon layer during the process sequence illustrated and described above with respect to FIG. 1A. The transistor gates are thus interconnected by means of polycide regions 22S and 24S which are contiguous with polycide regions 46 as illustrated in FIG. 2.

Figure 3:
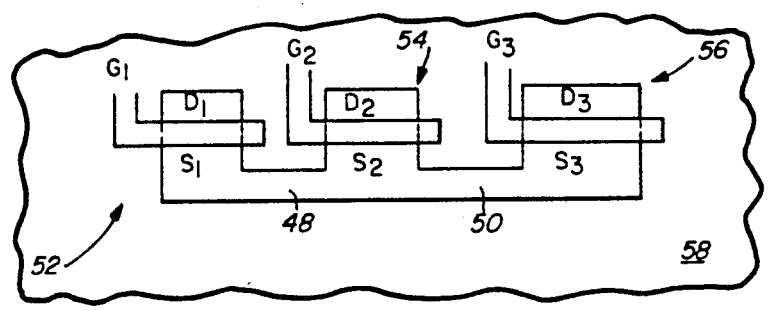
FIG. 3 is a top view illustrating formation of interconnect regions to interconnect source/drain regions of three field effect transistors in accordance with the present invention.

Referring to FIG. 3 there is illustrated a top view schematic in accordance with the present invention showing how the source/drain regions of three transistors can be connected together utilizing "metallized" regions of the semiconductor material itself as the interconnect. As is shown in FIG. 3 the semiconductor material has been patterned such that semiconductor interconnect regions 48 and 50 interconnect the source (or drains) of the three transistors 52, 54, and 56. Thus, the semiconductor material which may, for example, be silicon on insulating substrate 58, is not etched away in those regions where an interconnect is desired. Following formation of the transistors 52, 54 and 58 in accordance with well known techniques, the semiconductor material in regions 48 and 50 is metallized as by silioiding silicon to create the interconnects.

Figure 4A:
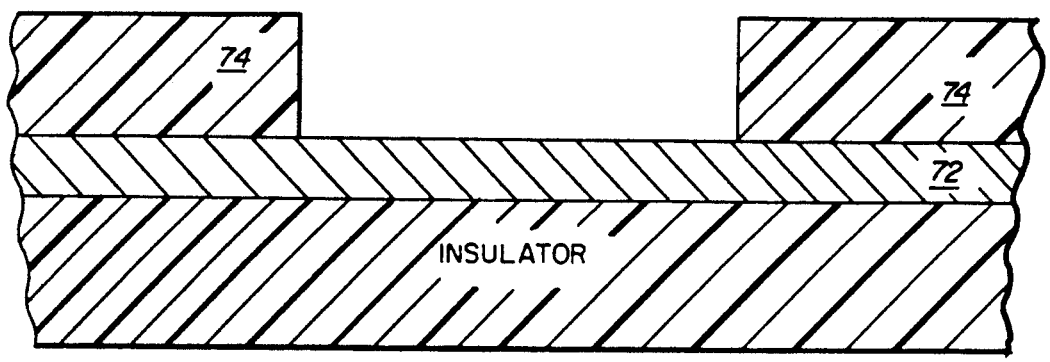
FIGS. 4A, 4B, and 4C are cross-sectional side views of a portion of a semiconductor-on-insulator structure illustrating an alternate embodiment of the present invention and illustrating sequential processing steps that could be used to create an interconnect cross over in accordance with the present invention.
Figure 4B:
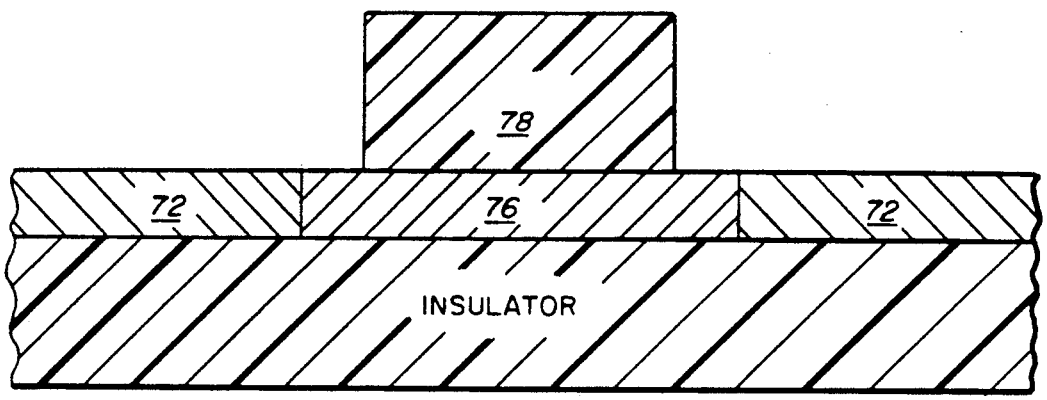
Figure 4C:
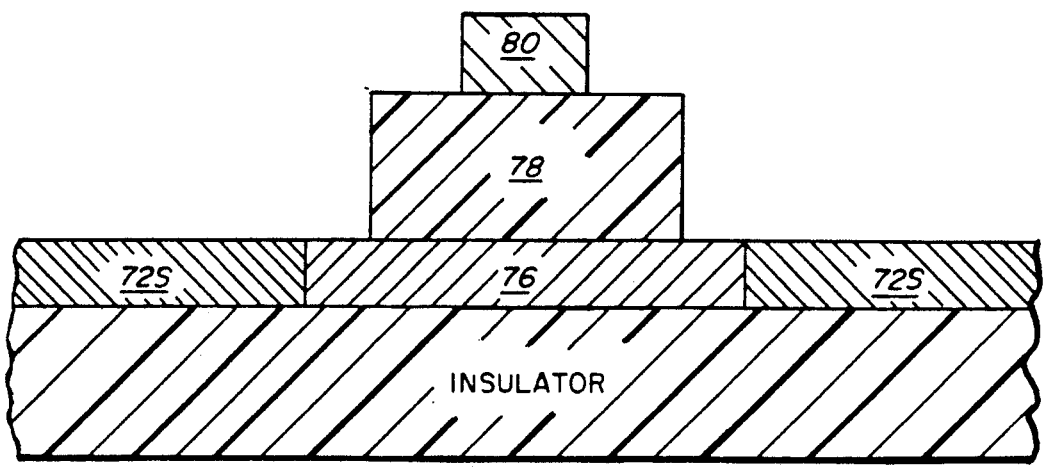

FIGS. 4A, 4B and 4C illustrate a portion of an integrated circuit, in sectional side view and illustrate a processing sequence which permits the polycide layer of interconnect to cross over the silicide layer of interconnect without contact between the polycide and silicide interconnects and without forming a parasitic transistor. These steps could, for example, be accomplished prior to the processing depicted in FIG. 1A. In this embodiment, a portion of the semiconductor layer is silicided prior to the formation of any polysilicon layer. The original silicon film 72 is masked by patterned silicon dioxide layer 74. A titanium layer (not shown) is then deposited, followed by silicide formation as described above. The titanium nitride, unreacted titanium and silicon dioxide layer 74 are then removed by standard etching techniques. Deposition and patterning of a thick silicon dioxide layer yields a structure as shown in FIG. 4B in which region 76 is silicide and region 78 is an interlevel dielectric spacer over which subsequent polycide interconnect layers or metal region 80 can be deposited and patterned as shown in FIG. 5C. Subsequent processing as described above, converts silicon layer 72 into silicide layer 72S, thereby forming a buried interconnect 76 without contacting polycide interconnect region 80.

Obviously many other modifications and variations of the present invention are possible in light of the above teachings. For instance, while the present invention has been illustrated and described with respect to two or three transistors, obviously it is within the scope of the present invention that it may be utilized with as few as one transistor such as in the creation of interconnects or contacts to a single millimeter wave microwave power field effect transistor. Similarly, it is within the scope of the present invention that it may be utilized to create a series of interconnect regions for an entire integrated circuit or, moreover, for an entire wafer. Further, within the scope of the present invention any process may be utilized to create the improved quality semiconductor material formed on the insulating substrate, i.e. the present invention is not limited to SOS or to DSPE. For instance, SIMOX could be utilized where silicon-on-silicon dioxide is used in lieu of SOS as in the examples described and disclosed above. Further, as additional variations and modifications of the present invention within the scope of the present invention other materials in lieu of titanium can be used to metallize the semiconductor material to convert it into a metallic compound of the semiconductor. For instance, instead of titanium molybdenum, chrome, cobalt or manganese may be used. It is therefore to be understood that within the scope of the appended claims the invention may be practiced otherwise than as specifically described.

We claim:

1. A process for developing conductive interconnects between integrated circuit semiconductor devices formed on an insulating substrate comprising:

forming a patterned layer of semiconductor material directly on the surface of said insulating substrate, said semiconductor material having a surface and also having an interface with said insulating substrate, said patterned layer comprising a first set of regions where at least one semiconductor device will be formed and a second set of regions where electrical interconnects to said at least one semiconductor device will be formed, said second set of regions extending through the entire region between said surface and said interface;

forming said at least one semiconductor device;

converting said second set of regions to a metallic compound of said semiconductor material; and further wherein:

said at least one semiconductor device has at least two terminals comprised of said semiconductor material; and where at least a portion of at least one of said terminals is converted to said metallic compound of said semiconductor material substantially simultaneously with said conversion of said second set of regions.

2. The process of claim 1 wherein:
said semiconductor material is single crystal silicon.

3. The process of claim 2 wherein:
said step of converting comprises siliciding said silicon.

4. The process of claim 2 wherein:
said step of converting comprises siliciding said single crystal silicon.

5. The process of claim 1 wherein said at least one semiconductor device comprises a plurality of semiconductor devices.

6. The process of claim 5 wherein said plurality of semiconductor devices are planar devices, all formed in substantially the same plane on said substrate.

7. The process of claim 1 wherein:
each of said at least one semiconductor devices is selected from the group consisting of diodes, transistors, resistors and capacitors.

8. The process of claim 7 wherein each of said at least one semiconductor devices is a planar device.

9. The process of claim 1 wherein:
said step of forming a patterned layer of semiconductor material comprises forming an improved layer of single crystal silicon on a sapphire insulating substrate using double solid phase epitaxy (DSPE).

10. The process of claim 1 wherein said at least one semiconductor device is a planar device.

11. The process of claim 1 wherein said step of forming said at least one semiconductor device includes the step of forming a sidewall spacer adjacent at least one of said two terminals.

12. The process of claim 11 wherein said two terminals comprise the source and drain terminals of a transistor and wherein said semiconductor device further comprises a gate terminal, and further wherein said sidewall spacer is formed so as to isolate said gate terminal from said source and drain terminals.

* * * * *